Aug. 13, 1974 D. F. ALLISON ET AL 3,829,335

METHOD FOR PROCESSING SEMICONDUCTOR WAFERS

Filed Oct. 20, 1972

United States Patent Office 3,829,335
Patented Aug. 13, 1974

3,829,335

METHOD FOR PROCESSING SEMICONDUCTOR WAFERS

David F. Allison, Los Altos, and John E. Schweizer, Jr., San Jose, Calif., assignors to Scientific Micro Systems, Inc., Sunnyvale, Calif.

Filed Oct. 20, 1972, Ser. No. 299,606
Int. Cl. H01l *7/44*
U.S. Cl. 148—189 7 Claims

ABSTRACT OF THE DISCLOSURE

A method for processing semiconductor wafers in which emitter-collector shorts are avoided in transistors formed in the semiconductor wafer. Investigation of emitter-collector shorts in semiconductor wafers has demonstrated by use of special etch techniques that emitter collector shorts are caused by dislocations in the crystal lattice of the semiconductor wafer. The dislocations are introduced into the semiconductor wafer during the various processing steps requiring the semiconductor wafer to be maintained at an elevated temperature. The dislocations and hence emitter-collector shorts are avoided by a method in which a semiconductor wafer is placed into a furnace at a temperature which is less than that which causes dislocations and then the furnace and hence the semiconductor wafer is heated up with the temperature rising at a rate below that which would introduce thermal stress and cause dislocations. After a desired operating temperature is reached a desired operation is performed on the semiconductor wafer and then the entire semiconductor wafer is cooled at a rate similar to that by which the temperature was previously raised.

BACKGROUND OF THE INVENTION

Electrical shorts between the emitter and collector of transistors in semiconductor integrated circuits have been one of the most serious problems confronting integrated circuit manufacturers. Especially as the complexity of integrated circuits increase such as with LSI (large scale integration) arrays in which a single chip or wafer may contain hundreds or even thousands of transistors or other devices, the problem of emitter-collector shorts has been serious. Typically, utilizing standard techniques for the manufacture of integrated circuits, approximately one transistor out of 500 will have an emitter-collector short and hence be worthless. If any transistor in an integrated circuit has an emitter-collector short, the entire integrated circuit is worthless and must be discarded.

The mechanism causing emitter-collector shorts has heretofore not been understood. In accordance with the present invention, the mechanism which causes emitter-collector shorts has been isolated and recognized and a process has been developed which avoids emitter-collector shorts in the manufacture and processing of semiconductor wafers.

SUMMARY OF THE INVENTION

Accordingly, it is an object of this invention to provide a method for processing semiconductor wafers which avoid emitter-collector shorts.

It is a more specific object of this invention to provide a method for processing semiconductor wafers in which desired operations are performed on the semiconductor wafers at elevated temperatures but in which the semiconductor wafers are brought up to the elevated temperature and cooled down from the elevated temperature at a rate which is insufficient to cause dislocations in the crystal lattice structure of the semiconductor material.

Briefly, in accordance with one embodiment of the invention, semiconductor wafers are processed in a furnace with the temperature of the furnace adjusted to a temperature which is below that which causes substantial dislocations in the crystal lattice of the semiconductor material. The semiconductor wafer is then introduced into the furnace and the furnace temperature is gradually increased to a desired operating temperature with the rate of increase of temperature being below that at which dislocations occur. Desired operations are then performed on the wafer and the furnace temperature is gradually decreased at a rate of temperature decrease below that at which dislocations occur. The semiconductor wafer is then removed from the furnace.

DESCRIPTION OF THE PREFERRED EMBODIMENTS

As mentioned above, emitter-collector shorts are a serious problem for integrated circuit manufacturers. It has been found on relatively complicated integrated circuits which may, for example, contain hundreds or even thousands of individual components that an emitter-collector short occurs in about one out of every five hundred transistors. This presents a serious yield problem and it has been found for example that many integrated circuits must be discarded as useless because they contain too many transistors having emitter-collector shorts to be usable.

Heretofore, no one has been entirely sure as to what caused emitter-collector shorts. In accordance with the present invention it has been discovered that emitter to collector shorts are caused by dislocations in the crystal lattice of the semiconductor material which, for example, is usually silicon. It has been known for some time that semiconductor material, silicon for example, frequently contains dislocations in the crystal orientation. Various etches are available and known to those skilled in the art for identifying or mapping dislocation lines on a semiconductor wafer.

Figure 1:
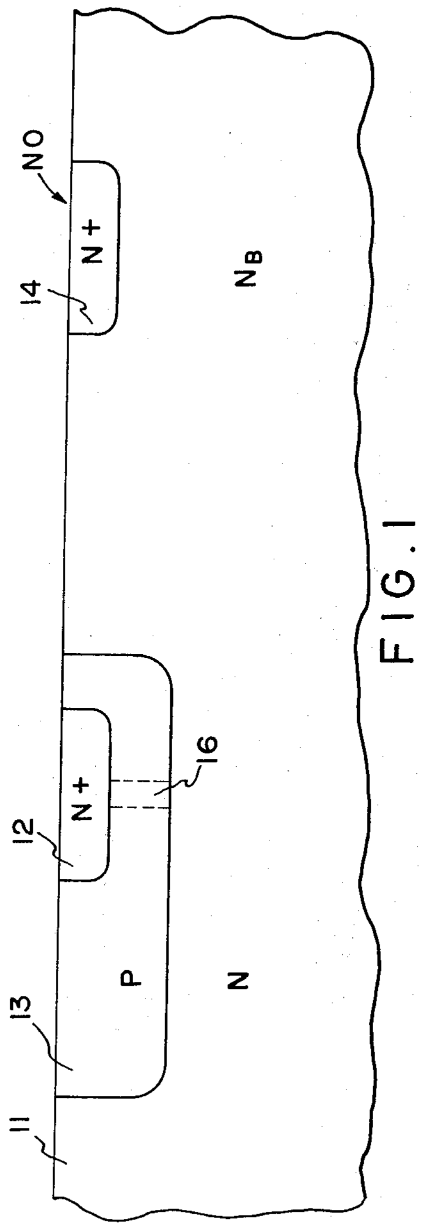
FIG. 1 is a sectional view through a portion of a semiconductor wafer and illustrating the presence of an emitter to collector short.

It has now been discovered that a modified dislocation type of etch can be utilized to identify on a semiconductor wafer those transistors which have emitter to collector shorts. Referring to FIG. 1, for example, there is shown a portion of an integrated circuit having a typical bipolar transistor formed therein. The transistor is formed in N-type bulk material 11 and comprises an N+ emitter region 12, a P-type base region 13, and an N+ region 14 comprising a collector contact to the bulk N-type material 11.

When an emitter-collector short occurs, there will be current leakage from the emitter region 12 to the collector region of bulk N-type material 11. This is illustrated schematically in FIG. 1 by the area shown by the dotted line and identified as region 16.

Because of semiconductor physics consideration an inherent voltage is developed in semiconductor material where the charge carrier concentration varies. This voltage is given by $$\psi=\frac{kT}{q}\ln\frac{N_o}{N_b} \quad (1)$$

where $k$ is Boltzman's constant, T is the Kelvin temperature, $q$ is the electronic charge and $N_o$ is the surface concentration of charge carriers and $N_b$ is the bulk concentration of charge carriers. Thus referring to FIG. 1 this voltage will be developed between the bulk N-type material 11 and the N+ region 14. This voltage will only be developed between the emitter N+ region 12 and the bulk material 11 if there is current leakage through the emitter-collector short indicated schematically by area 16.

Figure 2:
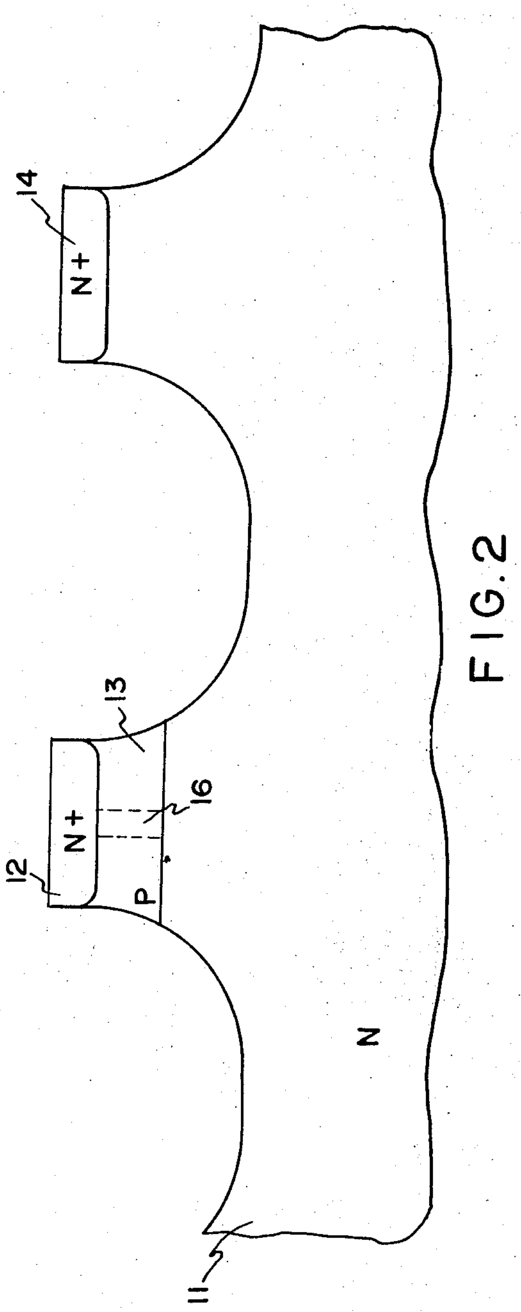
FIG. 2 is a sectional view of the transistor structure shown in FIG. 1 after it has been subjected to a particular etch which because of the emitter-collector short forms a mesa about the emitter of the transistor.

The transistors where an emitter-collector short occurs can be identified by subjecting an integrated circuit to a particular etch. For example, and etch solution was made of 500 grams of $Cr_2O_3$ and 100 ml. of deionized water. This solution was mixed in a two to one ratio of solution to hydrofluoric acid and then applied to the integrated circuit shown in FIG. 1. A much lower etch rate occurs where there is a voltage developed in accordance with Equation 1 due to differing surface and bulk concentrations of charge carriers. Referring now to FIG. 2, it can be seen that as the etch is applied mesas are formed underneath the N+ region 14 and underneath the N+ emitter region 12. The fact that a mesa was formed underneath the emitter region 12 indicates that there is an emitter to collector short 16. If there were no emitter to collector short 16 then a mesa would not have been formed around the emitter region 12; rather, the emitter and base region would have been etched away at the same rate as the surrounding N-type bulk semiconductor material. Because of the emitter-collector short, however, the voltage given by Equation 1 is developed between the emitter region 12 and the bulk semiconductor material 11 so that the mesa such as shown in FIG. 2 underneath the emitter region 12 does result.

Looking then at an integrated circuit which has been exposed to the etch discussed above, one can tell where there are emitter to collector shorts by noting those transistors on which mesas are formed surrounding the emitter regions. When semiconductor wafers are exposed to a dislocation etch or any of the other techniques for identifying dislocation lines in the semiconductor material, and then transistors or other devices are then formed in the semiconductor material and those transistors which have emitter to collector shorts are identified such as by the etch technique discussed above or any other technique including electrical testing, it is then found that the emitter to collector shorts follow the dislocation lines in the semiconductor material. That is, where there are dislocations in the crystal structure of the semiconductor material, emitter to collector shorts result in the completed integrated circuit.

Having thus identified that dislocations in the crystal structure are the cause of emitter to collector shorts in integrated circuits, the remaining portion of the problem is, of course, getting rid of or preventing the dislocations. It has been found that dislocations in the crystal structure of semiconductor material result generally from the thermal stresses that the semiconductor material undergoes during the various processing steps involved in manufacturing integrated circuits. A great deal of the manufacturing operation such as diffusion, oxidation, etc., take place with the semiconductor wafer at an elevated temperature. It has been found that by carefully controlling the manner and rate at which the semiconductor wafer is brought to the elevated temperature, and the manner and rate in which the semiconductor wafer is cooled down from the elevated temperature, that thermal stresses can be avoided and that dislocations are not introduced into the semiconductor material.

As an example, diffusion operations are carried out on semiconductor wafers with the wafers at an elevated temperature. Typically, a diffusion furnace is operated around 1250° C. When a wafer is to undergo a diffusion operation the wafer is placed in a holder called a "boat" in the art and then merely placed in the furance for a set period of time and exposed to diffusion gasses. The prior art has recognized the desirability of not having the semiconductor wafer undergo too drastic a temperature change because the wafers sometimes warp when merely placed quickly in the 1250° C. furance. Therefore, various "boat" pulling apparatus has been developed for moving semiconductor wafers relatively slowly into and out of a furnace. When semiconductor wafers are moved into a 1250° C. furnace from room temperature at a rate of, for example 1" per minute, for 3" wafers an 80° C. per minute rise in temperature of the wafer results. It has been found that while this 80° C. per minute temperature rise does not cause wafer warpage, that it does cause dislocations in the crystal structure of the semiconductor material. The dislocations are due not only to the relatively rapid rate of temperature rise but also to the fact that as the wafer is being moved into the furnace that various portions of the wafer are at various temperatures, resulting in thermal stresses which cause dislocations in the crystal structure.

It has also been found that maintaining a relatively slow rate of heating or cooling of semiconductor wafers so as to avoid dislocations is most important at temperatures above some specified minimum. Thus, for example, at temperatures below 800° C. dislocations are not introduced in the semiconductor material with temperature rates of 100° C. per minute. On the other hand, at temperatures between 900° C. and 1250° C. and above a temperature change rate of 80° C. per minute does produce severe dislocations in semiconductor wafers.

In accordance with the method of this invention, when it is desired to conduct a processing or manufacturing operation upon a semiconductor wafer in a furnace, the temperature of the furnance is first reduced to an adjusted temperature which is approximately 800° C. or below. After the furnace is stabilized at the adjusted temperature, the wafer is introduced into the furance, preferably at a rather slow rate so that the temperature change of the wafer from ambient to the adjusted temperature is less than approximately 100° C. per minute so as not to wrap the wafer. After the wafer has been placed in the furnace the temperature of the furnace is brought up at a slow rate to a desired operating temperature. For example, if a diffusion operation is to be conducted, the temperature of the furnace may be gradually brought up from around 800° C. to 1250° C. In accordance with this invention it has been discovered that the temperature change rate should not exceed approximately 25° C. per minute in order to avoid introducing dislocations into the semiconductor material. With this range of temperature rise and due to the fact that as the temperature of the furnace comes up all portions of the semiconductor wafer are being subjected to relatively the same temperature rather than having great temperature differentials across the surface of the wafer, thermal stresses are not set up in the wafer and dislocations do not occur in the crystal lattice.

After the temperature of the furnace and hence the wafer has been brought up to a desired operating temperature greater than 1000° C. such as 1250° C., then any desired operations such as a diffusion operation for example, is carried out upon the wafer. After completion of the desired operation the furnace with the wafer inside is brought down in temperature from the desired operating temperature (1250° C. for example) back to the adjusted temperature (on the order of 800° C. for example) at a gradual rate. It has been found that the rate of cooling the semiconductor wafer should be approximately that at which the temperature of the semiconductor wafer was increased in order to avoid introducing dislocations into the semiconductor material. Therefore, the rate of cooling should be on the order of 25° C. per minute or less in order to avoid introducing dislocations into the semiconductor wafer. After the temperature of the furnace and wafer has been brought back down to the adjusted temperature which, as explained above, may be on the order of 800° C., then the semiconductor wafer is removed from the furnace. Again, preferably the wafer is slowly removed from the furnace so that the rate of temperature change of the semiconductor wafer from 800° C. back to room temperature does not exceed values on the order of magnitude of 80° C. to 100° C. per minute.

The temperature ranges and rates discussed above have been found to be preferable ranges and rates for wafers having a 3" diameter, which is one of the standard size semiconductor wafers used in the semiconductor industry. Another standard semiconductor wafer size is a 2" diameter. For 2" diameter wafers the heating and cooling rates may be increased slightly while still avoiding introducing dislocations into the semiconductor material. For 2" diameter wafers heating and cooling rates on the order of 30° C. to 35° C. but less than 35° C. per minute will generally not introduce any dislocations into the semiconductor material although it is important that while heating or cooling a 2" diameter semiconductor wafer at temperatures substantially above 800° C. that the entire wafer be heated or cooled at the same rate so as not to introduce temperature differentials within the wafer which would result in thermal stresses and cause dislocations.

It is important that every processing operation on a semiconductor wafer which involves heating the wafer to an elevated temperature or cooling the wafer from an elevated temperature be carried out such that at temperatures above a certain minimum which is around 800° C., that the rate of temperature increase or decrease be kept at a fairly low value so as not to introduce thermal stresses which result in dislocations. This relatively slow rate of heating or cooling must be carried out for all the operations which involve heating or cooling the semiconductor wafer. As previously mentioned, in prior art processing methods for semiconductor wafers it has been found that emitter to collector shorts occur in about, on a statistical basis, one out of every five hundred transistors in an integrated circuit. It has been found that when semiconductor wafers are processed in accordance with the method of this invention, that emitter to collector shorts occur on a statistical basis in approximately one out of one hundred thousand transistors. Thus utilizing the method of this invention emitter to collector shorts in integrated circuits ceases to be the substantial problem which it has heretofore been.

While specific embodiments and temperature ranges have been specified in the examples set forth herein, it is obvious that various modifications may be made to the specific embodiments disclosed without departing from the true spirit and scope of the invention.

We claim:

1. In a method for processing silicon semiconductor wafers in a diffusion furnace, to minimize the formation of dislocations in the crystal structure of the silicon semiconductor wafers, the steps of adjusting the temperature of the furnace to an adjusted temperature which is below that which causes substantial dislocations in the crystal lattice of the material forming the wafer when the wafer is introduced into the furnace;

introducing the wafer at room temperature into the furnace after the adjusted temperature has been reached;

gradually increasing the furnace temperature to an elevated temperature used for diffusion at a rate below that at which dislocations occur;

performing a diffusion operation on the wafer;

gradually decreasing the furnace temperature from the elevated temperature to the adjusted temperature at a rate below that at which dislocations occur;

and removing the semiconductor wafer from the furnace to permit it to cool to room temperature.

2. A method in accordance with Claim 1 wherein the adjusted temperature is approximately 800° C. or below.

3. A method in accordance with Claim 2 wherein the wafer is introduced into the furnace at a sufficiently slow rate so that the rate of temperature change of the wafer from ambient room temperature to the adjusted temperature is less than approximately 100° C. per minute.

4. A method in accordance with Claim 3 wherein the wafer is removed from the furnace at a sufficiently slow rate so that cooling to ambient room temperature does not exceed values on the order of 80° C. to 100° C. per minute.

5. A method in accordance with Claim 1 wherein the elevated temperature is greater than 1000° C.

6. A method in accordance with Claim 1 wherein the rate at which the furnace temperature is increased and decreased is less than approximately 25° C. per minute.

7. A method in accordance with Claim 1 wherein the rate at which the furnace temperature is increased and decreased is less than approximately 35° C. per minute.

References Cited

UNITED STATES PATENTS

| | | | |
|---|---|---|---|
| 3,723,053 | 3/1973 | Myers et al. | 148—1.5 X |
| 3,615,944 | 10/1971 | Sheng et al. | 148—189 |
| 3,649,388 | 3/1972 | Joshi et al. | 148—189 |
| 3,737,282 | 6/1973 | Hearn et al. | 148—1.5 X |
| 3,620,850 | 11/1971 | Deal | 148—1.5 |

GEORGE T. OZAKI, Primary Examiner

U.S. Cl. X.R.

148—186, 1.5, 187